United States Patent [19]

Curtis, III

[11] Patent Number: 4,556,276

[45] Date of Patent: Dec. 3, 1985

[54] SOLDER BEAMS LEADS

[75] Inventor: Hazen Curtis, III, Andover, Mass.

[73] Assignee: AT&T Bell Laboratories, Murray Hill, N.J.

[21] Appl. No.: 492,213

[22] Filed: May 6, 1983

[51] Int. Cl.[4] .......................... H01R 4/02; H01R 11/22
[52] U.S. Cl. ............................. 339/258 R; 339/275 B
[58] Field of Search ............ 339/258 R, 258 P, 275 B, 339/17 C, 275 R, 275 T

[56] References Cited

U.S. PATENT DOCUMENTS

| | | | |
|---|---|---|---|
| 3,351,704 | 11/1967 | Sitzler | 174/84 |
| 3,750,252 | 8/1973 | Landman | 29/191.6 |
| 3,764,955 | 10/1973 | Ward | 339/17 LM |
| 3,787,801 | 1/1974 | Teagno et al. | 339/258 R |
| 3,889,364 | 6/1975 | Krueger | 29/628 |
| 3,953,102 | 4/1976 | Rivetta et al. | 339/258 R |
| 4,019,803 | 4/1977 | Schell | 339/275 B |
| 4,120,558 | 10/1978 | Seidler | 339/275 T |
| 4,203,648 | 5/1980 | Seidler | 339/275 T |
| 4,302,067 | 11/1981 | Monson et al. | 339/275 R |
| 4,345,814 | 8/1982 | Gutbier et al. | 339/275 R |
| 4,357,069 | 11/1982 | Milora | 339/275 R |

OTHER PUBLICATIONS

Technical drawings of the "Kansas City" terminal, of Western Electric Company, Kansas City.

Primary Examiner—Gil Weidenfeld
Assistant Examiner—Gary F. Paumen
Attorney, Agent, or Firm—Volker R. Ulbrich

[57] ABSTRACT

A solder bearing hybrid integrated circuit terminal 16 is formed from a metal strip so that one finger 26 of the clip portion 18 is formed by the strip being folded back on itself. A second opposing finger 28 spaced from the first finger 26 includes in its end portion a slot 30 which extends around the free end of the finger 28 to form a solder preform clamp 34 by a reverse curving of the metal strip about the free end of the second finger 28. A stem 20 extends from the clip 18 opposite and parallel to the direction of the fingers 26, 28. This permits clearer access to the substrate 12 to which the terminal 16 is assembled and soldered. The stem 20 may later be bent at right angles to the substrate 12 for assembling the finished device 44 to a circuit board. Stop tab 36 are provided at the bottom of the recess between the fingers 26,28 for spacing the edge of the substrate 12 from the metal strip which forms the clip 18 of the terminal 16.

6 Claims, 6 Drawing Figures

SOLDER BEAMS LEADS

BACKGROUND OF THE INVENTION

Field of the Invention

The invention relates to metal terminals of the type which are soldered to hybrid integrated circuit substrates for connecting substrates to a circuit board.

A hybrid integrated circuit is a micro-circuit formed by attaching discrete components and semiconductor devices to networks of passive components and conductors that have been vacuum deposited in this film on glazed ceramic, sapphire, or glass substrates. These substrates are generally rectangular. Arranged along their longer edges are a number of contact pads in the form of conducting film rectangles spaced from each other and extending almost to the edge. In order to connect the substrate to an ordinary circuit board, a number of terminals are clipped to the edge of the substrate in contact with the pads. They are soldered in place and fastened to the circuit board by means of stems which include pins for insertion in holes in the board. A particular substrate may have anywhere from several to fifty or more terminals of this type attached to it. Since there are many different kinds of hybrid integrated circuits in use today, terminals of this type are used in very large numbers.

There are various different designs for hybrid integrated circuit terminals which reflect efforts to reduce one or more common problems in using them. Such problems usually involved either the failure of a particular terminal to make adequate contact to its contact pad or the shorting together of adjacent terminals to each other by the unintentional flow of solder between their respective contact pads during the soldering process.

One for of such a terminal which is generally referred to as a "solder bearing" is designed so that a solder pre-form is held in a contact finger prior to assembly of the terminal of the substrate. This provides a precisely measured amount of solder for making the bond upon heating after assembly. There is a continuing need to improve the design of hybrid integrated circuit terminals for better reliability and structural integrity.

SUMMARY OF THE INVENTION

The novel terminal in accordance with the present invention has a first clip finger formed by a section of the metal strip making up the terminal. The strip is folded back on itself so that one side of the clip is at least twice the thickness of the strip. The second finger includes an end portion which is arcuately reverse curved from the free end to form a clamp for holding a piece of solder. The end portion of the second finger has a centrally disposed slot which extends from that portion of the free end closest to the first finger around the free end portion.

The folded over arrangement for the first finger permits the entire width of the metal strip to be used for that finger and also for the second finger. This provides a firm grip of the clip for a contact pad of reduced width and depth, such as in some hybrid integrated circuit substrates on which the area is at a premium. The clamp portion firmly holds a solder preform and permits flow of the solder through the slot directly to the contact pad. The stem of the terminal may extend from the clip portion in a direction parallel to, but opposite the direction in which the fingers extend. This permits free access to the surface of the substrate after the clips have been assembled to it. The terminals can later be bent at right angles to the substrate surface, which is their normal configuration.

DETAILED DESCRIPTION

Figure 1:
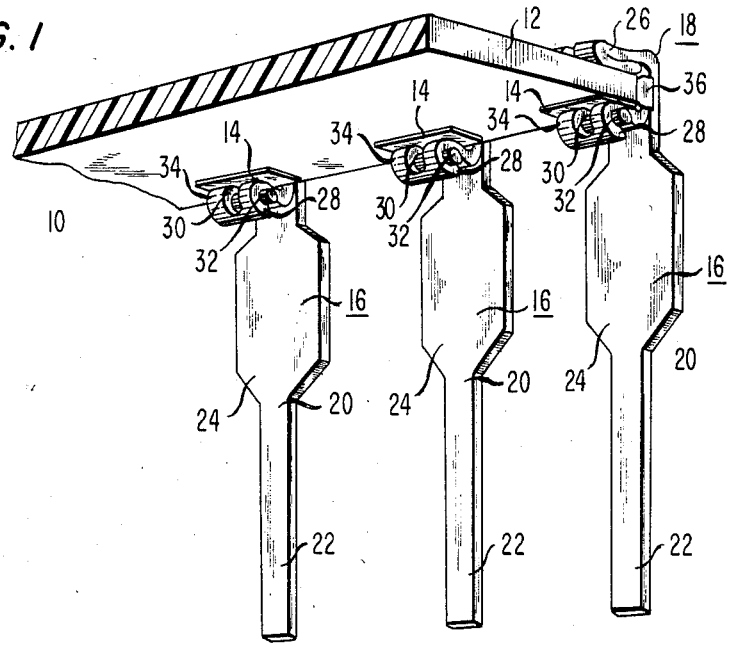
FIG. 1 is a perspective view of a fragment of a hybrid integrated circuit substrate which includes three contact pads and shows three solder bearing terminals assembled to the substrate with their solder performs held in the clamp portion prior to the solder being melted for bonding to the contact pads.

The fragment of substrate assembly 10 of FIG. 1 includes a ceramic substrate 12 with three contact pads 14. Clipped to the edge of the substrate 12 are three terminals 16, which include a clip 18 and a stem 20. They are made of phosphor-bronze alloy base-metal which has been precoated with solder on both sides. The stem has a pin section 22 and widened leg section 24. The pin section 22 is adapted to be inserted into the corresponding openings in the circuit board and soldered thereto. The widened section 24 provides additional rigidity of the stem and a stop when the assembly is inserted into a circuit board. The clip portion 18 includes a first contact finger 26 which is directly opposed to a second contact finger 28. The contact fingers 26, 28 resiliently engage the circuit board with a firm grasp to make a contact of the second contact finger 28 to the contact pad 14. The second contact finger 28 includes a slot 30 which extends from that portion of the finger 28 which is in contact with the contact pad 14 around the free end of the finger 28 to near the end of the metal strip which forms it. This slot permits flow solder from a solder preform element 32, held in a clamp portion 34 at the outer end of the second contact finger 28, to the contact pad 14. The slot 30 is of a width which is about one third the width of the metal strip which forms the clamp portion 34 of the second contact finger 28. A stop tab 36 extends from the edge of the terminal metal strip on each side at the bottom of the gap formed between the contact fingers 26, 28 and is bent in the direction of the contact fingers 26, 28 to provide a clearance between the edge of the substrate 12 and the metal strip of the clip portion 18. The stop tabs 36 serve to space the edge of the substrate from the bottom of the gap in the clip 18. This prevents the sharp edges of the substrate 12 from possibly damaging or deforming the clip 18 when the terminals 16 are assembled to the substrate 12.

Figure 2:
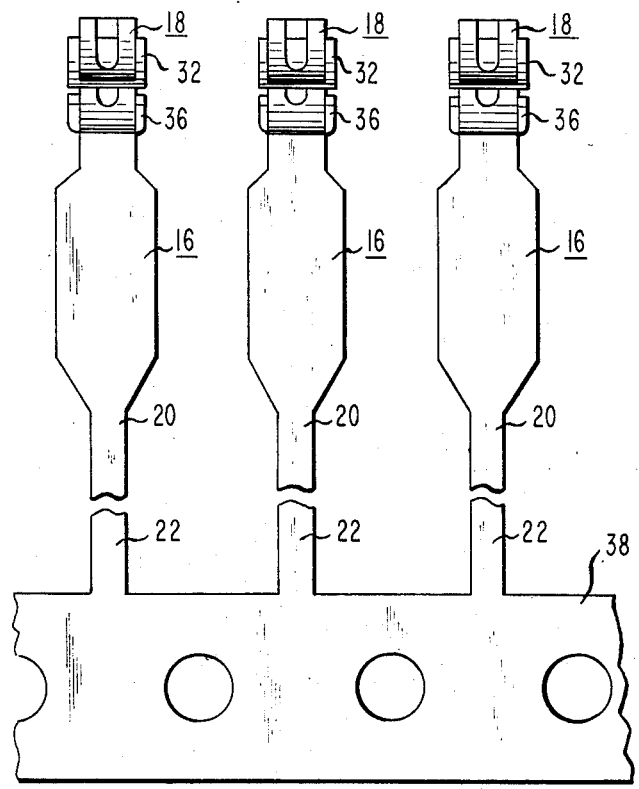
FIG. 2 is a front view of three terminals in accordance with the present invention in one stage of their manufacture, while they are still attached to a mounting strip.

FIG. 2 shows several of the terminals 16 as they are supplied prior to assembly to the substrate 12. They are made of a base metal of phosphor bronze and attached to a mounting strip 38 for ease of handling.

Figure 3:
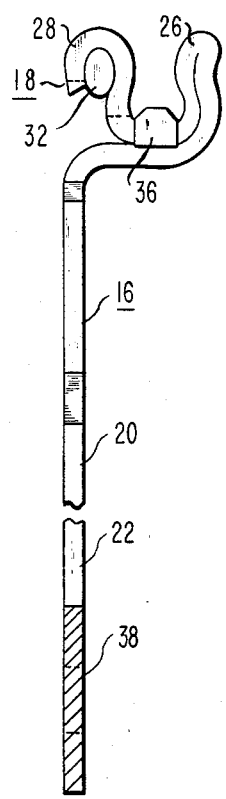
FIG. 3 is a side view of one of the terminals of FIG. 2 and its attached segment of mounting strip.

FIG. 3 shows a side view of one of the terminal 16 of FIG. 2. In all the figures the same reference numerals are used for corresponding elements. It is noted that at this stage the stem 20 extends in the opposite direction and parallel to the direction in which the fingers 26, 28 extend. The solder preform 32 is compressed in the clamp section 34 so that it is firmly held and pressed into an oval cross section. This results in some of the solder being pressed into the slot 30 and nearly into contact with the contact pad 14 to improve the resulting solder bonding.

Figure 4:
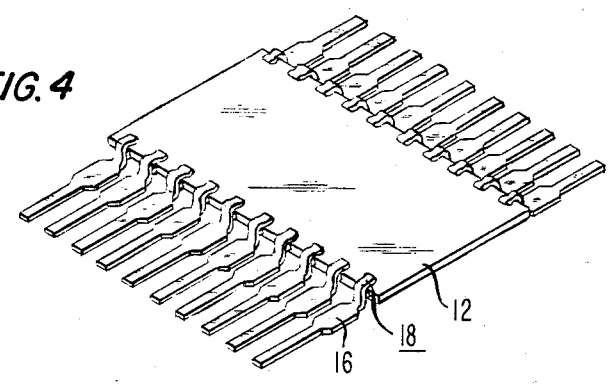
FIG. 4 shows a substrate to which there have been assembled a number of terminals such as those of FIG. 3 with their mounting strip removed.

FIG. 4 is an elevational perspective showing the entire substrate 12 with its terminals 16 clipped to it. The assembly has beem heated in an ambient of the sufficiently high temperature to cause the solder preforms 32 to melt and thereby bond the terminals 16 to the contact pads 14. The particular circuit on the substrate 12 is not visible in this figure because it is on the underside of the substrate 12. However, it can be seen that because the stems 20 of the terminals 16 extend from the clip portions 18 in a direction parallel to the fingers 26, 28, there is ready access to the circuit on the substrate. This makes it possible to readily perform wire and die compression bonding of leads from a silicon very large scale integrated circuit chip, to be included in the circuit, to the various conductive elements of the circuit. This is preferably done after the soldering of the terminals 16 to the substrate 12 in order to avoid failures due to terminals after such an integrated circuit has been committed to the device. Frequently the integrated circuit chip has a value much greater than the remainder of the device structure.

Figure 5:
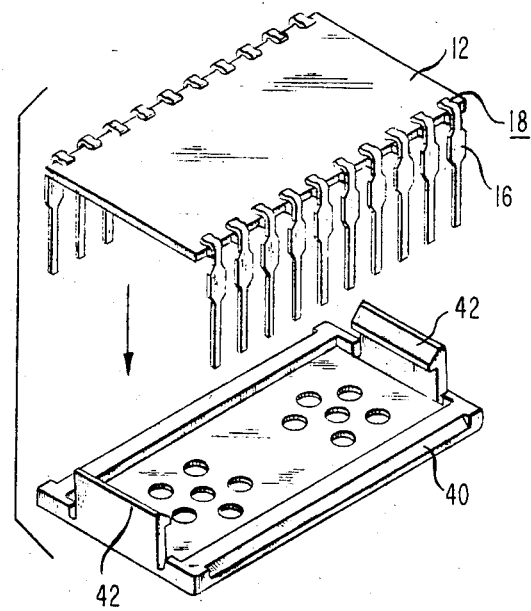
FIG. 5 shows the substrate and terminals of FIG. 4 after the terminal stems have been bent at right angles to the substrate, with the assembly being positioned for joining with a protective cover member.

FIG. 5 shows the assembly of FIG. 4 after the wire and die compression bonding procedures or other procedures which require open access to the circuit have been completed and after the terminals have been bent down at right angles to the surface of the substrate 12. The assembly 10 is now ready for joining with a protective cover 40 which snaps to the substrate 12 by means of two clips 42.

Figure 6:
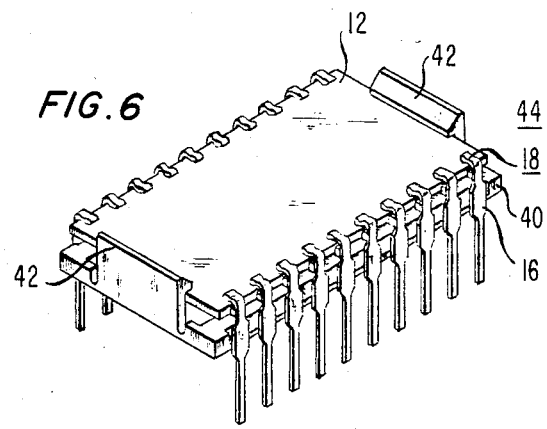
FIG. 6 shows a finished device including the substrate and its terminals joined with its a protection cover member.

In FIG. 6 there is shown the completed circuit device 44 with the protective cover 40 joined to it.

The stems 20 are bent at a right angle to the first, folded contact finger 26 and then bent in the reverse direction under the second contact finger 28. It is this reverse bend under the second contact finger 28 which is straightened out to leave the stem at a right angle to the direction of the substrate 12. This is particularly advantageous in that there may be solder flow back on that part of the stem 20 near the folded contact finger 28. Such solder flow would vary from terminal to terminal and therefore would make it difficult to perform a uniform bending procedure on the terminals 16 as a group. With the double bend arrangement that portion of the stem 20 which will be involved in the bending process after the soldering can be readily kept clear of solder.

This can be done by providing between the second bend and the folded contact finger 28 a section of stem which is resistant to solder flow. One way of doing this is to skive, or shave the precoated solder off the base metal there before the forming of the terminal and permitting an oxide coating to form on it.

What is claimed is:

1. a solder-bearing terminal of the type having a clip and a stem formed by a flat metal strip, the clip having first and second opposing resilient clamping fingers spaced from each other to form a receiving gap opening for the edge of a circuit substrate to be connected to the terminal, the free end portions of the fingers being arcuately curved outward, away from each other, and the stem extending from the clip with a pin section suited for connection to a circuit board, the first finger is formed by a section of the strip which is folded back on itself so that the first finger of the clip is at least twice the thickness of the strip, the folded back strip portion of said first finger being bent around the bottom of the clip to extend as a stem from below the bottom of, and in a direction generally parallel to, the second finger, and the second finger includes an end portion which is arcuately reverse curved from the free end to form a clamp for holding a piece of solder, the end portion of the second finger comprising a centrally disposed slot which extends from that portion of the free end closest to the first finger around the free end portion.

2. The terminal defined in claim 1 wherein the stem comprises two substantially right angle bends in opposite directions, one below each of the fingers, and extends from the side of the clip below the second finger in a direction generally parallel with and opposite to the direction in which the fingers extend.

3. The terminal defined in claim 2 comprising a spacer tab extending from at least one edge of the strip at the bottom of the receiving gap and bent toward the opening of the gap to maintain a predetermined clearance between the bottom of the gap opening and a substrate edge which is to be inserted therein.

4. The terminal defined in claim 3 comprising a cylindrical segment of solder resiliencey held in the clamp.

5. The terminal defined in claim 4 wherein the stem includes a widened section between the clip and the pin section.

6. The terminal defined in claim 5 wherein the slot is about one-third as wide as the metal strip portion which forms the clamp.

* * * * *